United States Patent
Fukuhara

(10) Patent No.: US 7,009,879 B2
(45) Date of Patent: Mar. 7, 2006

(54) TEST TERMINAL NEGATION CIRCUIT FOR PROTECTING DATA INTEGRITY

(75) Inventor: Shuro Fukuhara, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/090,195

(22) Filed: Mar. 28, 2005

(65) Prior Publication Data

US 2005/0213403 A1    Sep. 29, 2005

(30) Foreign Application Priority Data

Mar. 29, 2004    (JP) ............................. 2004-094572

(51) Int. Cl.
*G11C 29/00*    (2006.01)
(52) U.S. Cl. ............................. 365/185.04; 365/185.09
(58) Field of Classification Search ........... 365/185.09, 365/185.04, 185.24
See application file for complete search history.

(56) References Cited

U.S. PATENT DOCUMENTS

| | | | |
|---|---|---|---|
| 5,870,342 A | 2/1999 | Fukuda | ....................... 365/201 |
| 6,424,142 B1 * | 7/2002 | Kato et al. | ................ 324/158.1 |
| 6,747,905 B1 * | 6/2004 | Ho | .......................... 365/189.11 |
| 6,839,293 B1 * | 1/2005 | Kawamoto et al. | ......... 365/201 |
| 2002/0034112 A1 | 3/2002 | Tetsuo et al. | ................ 365/201 |
| 2003/0198082 A1 * | 10/2003 | Silverbrook et al. | ... 365/185.04 |

FOREIGN PATENT DOCUMENTS

| JP | 2002-269523 A | 9/2002 |
|---|---|---|
| WO | WO-01/59571 A | 8/2001 |

* cited by examiner

*Primary Examiner*—Andrew Q. Tran
(74) *Attorney, Agent, or Firm*—Birch, Stewart, Kolasch & Birch, LLP

(57) ABSTRACT

A test terminal negation circuit comprises a switch circuit which receives a test signal from a test terminal and outputs it in an asserted state as it is or in a predetermined negated state to a test object circuit, a test signal control circuit which controls an output signal of the switch circuit to be asserted or negated, a test mode signal generation circuit which generates a test mode signal which asserts the output signal of the switch circuit, and a negating signal generation circuit which can output a negating signal for forcing the output signal of the switch circuit into negated state and comprises an electrically rewritable nonvolatile memory element. When the test signal control circuit receives the negating signal, it does not assert the output signal of the switch circuit even it receives the test mode signal.

7 Claims, 5 Drawing Sheets

TEST TERMINAL NEGATION CIRCUIT FOR PROTECTING DATA INTEGRITY

CROSS REFERENCE TO RELATED APPLICATION

This Nonprovisional application claims priority under 35 U.S.C. §119(a) on Patent Application No. 2004-094572 filed in Japan on Mar. 29, 2004, the entire contents of which are hereby incorporated by reference.

BACKGROUND OF THE INVENTION

1. Field of the Invention

The present invention relates to a test terminal negation circuit in which a test signal from a test terminal is not received using a nonvolatile memory after a test is completed.

2. Description of the Related Art

Recently, an IC card on which a nonvolatile memory is mounted has been a focus of attention. Although a terminal of the IC card is standardized in ISO7816, there are various kinds of test terminals to facilitate a test. In a normal operation, since data is exchanged by authenticating the reader/writer and the like and encrypting the data, secret data is not leaked.

As a conventional technique, there is a method of outputting a test signal from a test terminal to a test object circuit by activating an output of a test mode signal generation circuit to turn on a switch circuit when the test terminal is used, and a circuit constitution in the method is shown in FIG. 3 (refer to Japanese Unexamined Patent Publication No. 2002-269523, for example). Referring to FIG. 3, each circuit comprises a test terminal 301, a switch circuit 302, a nonvolatile memory circuit 303 to be tested, and a test mode signal generation circuit 304. The switch circuit 302 is turned on when an output N3 of the test mode signal generation circuit 304 is activated, and then an output N1 of the test terminal 301 is transmitted to an output N2 of the switch circuit 302 to control the nonvolatile memory circuit 303. In addition, the switch circuit 302 is turned off when the output N3 of the test mode signal generation circuit 304 is inactivated, so that the output N1 of the test terminal 301 is not transmitted to the output N2 of the switch circuit 302. As a result, the nonvolatile memory circuit 303 cannot be controlled from the test terminal 301.

However, when a test mode is activated falsely by operating the test mode signal generation circuit for use other than the test, information in an IC card could be easily read out using the test terminal.

In addition, although Japanese Unexamined Patent Publication No. 2002-269523 discloses a method of erasing information stored in a nonvolatile memory in an IC card when it is detected that a test mode is activated falsely, it is necessary to provide an additional circuit to detect the false activation of the test mode in this method.

SUMMARY OF THE INVENTION

The present invention has been made in view of the above problems and it is an object of the present invention to prevent a test mode from being falsely activated from a test terminal by negating the test terminal in a simple circuit constitution.

A test terminal negation circuit according to the present invention to attain the object comprises a switch circuit which receives a test signal from one or more test terminals and outputs it in an asserted state as it is or in a predetermined negated state to a test object circuit, a test signal control circuit which controls an output signal in the asserted state or the negated state of the switch circuit, a test mode signal generation circuit which generates a test mode signal which asserts the output signal of the switch circuit and outputs it to the test signal control circuit at the time of a test mode, and a negating signal generation circuit which can output a negating signal to negate the output signal of the switch circuit by force, to the test signal control circuit and comprises an electrically rewritable nonvolatile memory element, in which when the negating signal is outputted from the negating signal generation circuit, the test signal control circuit negates the output signal of the switch circuit even when the test mode signal is outputted from the test mode signal generation circuit.

In addition, the test terminal negation circuit according to the present invention is characterized in that the negating signal generation circuit comprises a first nonvolatile memory element and a second nonvolatile memory element which have a MOSFET structure, a first inverter circuit and a second inverter circuit, in which sources of the first nonvolatile memory element and the second nonvolatile memory element are connected to the ground voltage, gates of the first nonvolatile memory element and the second nonvolatile memory element are connected to a power supply voltage, a drain of the first nonvolatile memory element is connected to an input of the first inverter circuit and an output of the second inverter circuit, and a drain of the second nonvolatile memory element is connected to an output of the first inverter circuit and an input of the second inverter circuit, and the output of the second inverter circuit is an output of the negating signal generation circuit.

Furthermore, the test terminal negation circuit according to the present invention is characterized in that an output level of the negating signal generation circuit is varied by a threshold voltage difference between the first nonvolatile memory element and the second nonvolatile memory element.

According to the test terminal negation circuit of the present invention, once the negating signal generation circuit outputs the negating signal, since the test signal for activating the test mode is outputted in a negated state from the switch circuit, the test mode is prevented from being falsely activated from the test terminal without detecting false activation.

A method of negating a test terminal according to the present invention to attain the object is characterized in that the negating signal is outputted by performing electrical rewriting in the nonvolatile memory element in the negating signal generation circuit in the test terminal negation circuit according to the present invention after a test is completed. Especially, when the negating signal generation circuit comprises the first nonvolatile memory element and second nonvolatile memory element having the MOSFET structure, the first inverter circuit and the second inverter circuit as described above, it is preferable that the negating signal is outputted by performing electrical rewriting in either one of the first nonvolatile memory element or the second nonvolatile memory element in the negating signal generation circuit after a test is completed.

According to the test terminal negating method of the present invention, since the negating signal generation circuit outputs the negating signal using the test terminal negation circuit according to the present invention after the test is completed, the test mode is prevented from being activated falsely from the test terminal, so that data in the test object circuit is prevented from being operated by the test terminal.

A nonvolatile semiconductor memory device according to the present invention is characterized by comprising the test terminal negation circuit having the above characteristics. In addition, an IC card of the present invention is characterized by comprising the nonvolatile semiconductor memory device having the above characteristics. Thus, information in the nonvolatile semiconductor memory device or the IC card is prevented from being read illegally.

DESCRIPTION OF PREFERRED EMBODIMENTS

Figure 1:
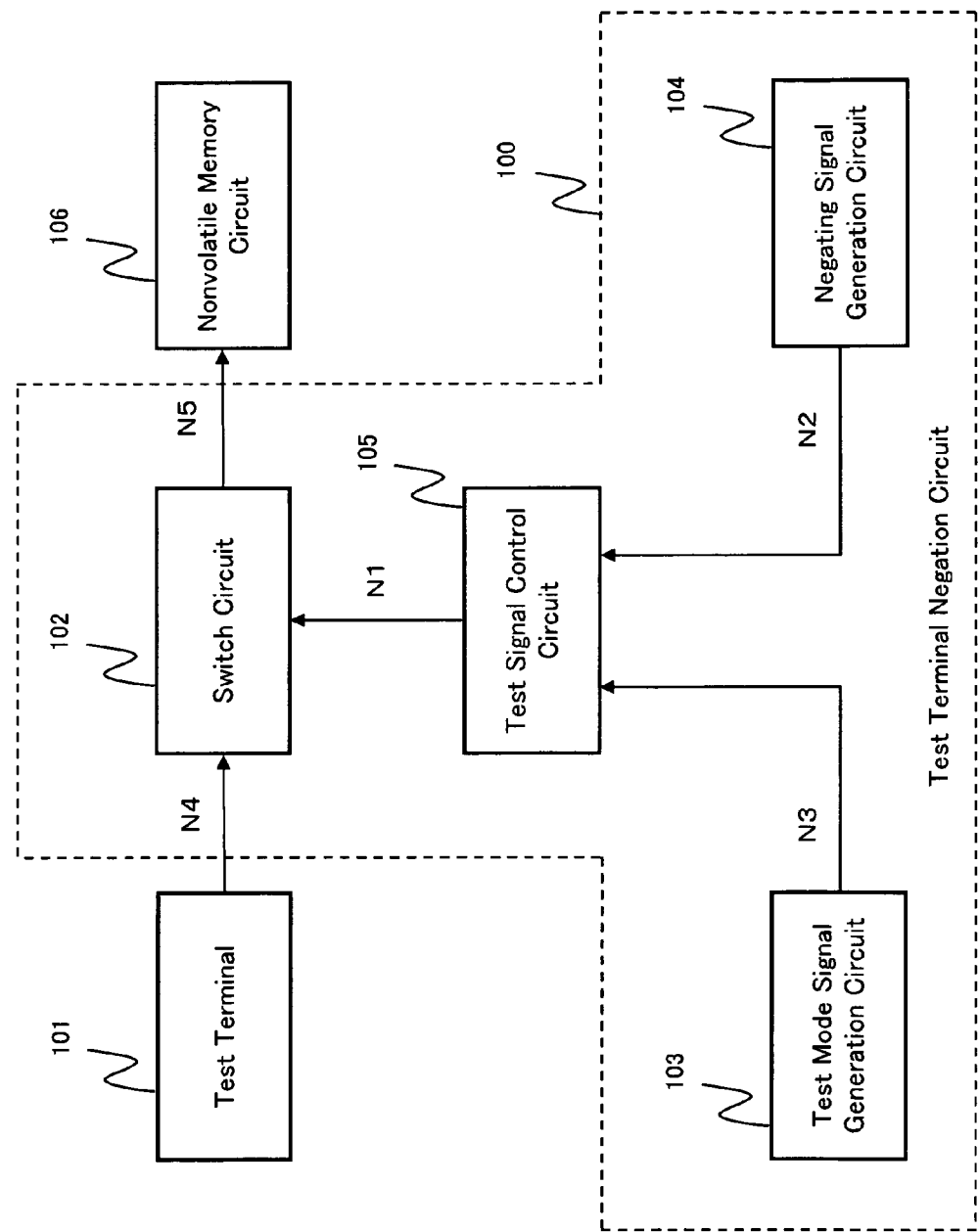
FIG. 1 is a circuit diagram showing an embodiment of a test terminal negation circuit according to the present invention.

An embodiment of the present invention will be described with reference to the drawings. FIG. 1 is a circuit diagram showing an embodiment of a test terminal negation circuit according to the present invention (referred to as "the circuit of the present invention" occasionally hereinafter). As shown in FIG. 1, a circuit 100 of the present invention comprises a switch circuit 102, a test mode signal generation circuit 103, a negating signal generation circuit 104, and a test signal control circuit 105.

The switch circuit 102 receives a test signal from a test terminal 101 and outputs it in an asserted state as it is or in a predetermined negated state, to a nonvolatile memory circuit 106 which is an object circuit to be tested, depending on a level of an output node N1 of a test signal control circuit 105. The switch circuit 102 comprises, for example, a CMOS transfer gate and the like.

The test mode signal generation circuit 103 outputs a test mode signal which asserts a signal outputted from an output node N5 of the switch circuit 102, from an output node N3 to the test signal control circuit 105 at the time of a test mode, so that the test signal from the test terminal 101 is outputted to the nonvolatile memory circuit 106 as it is in the asserted state.

Figure 2:
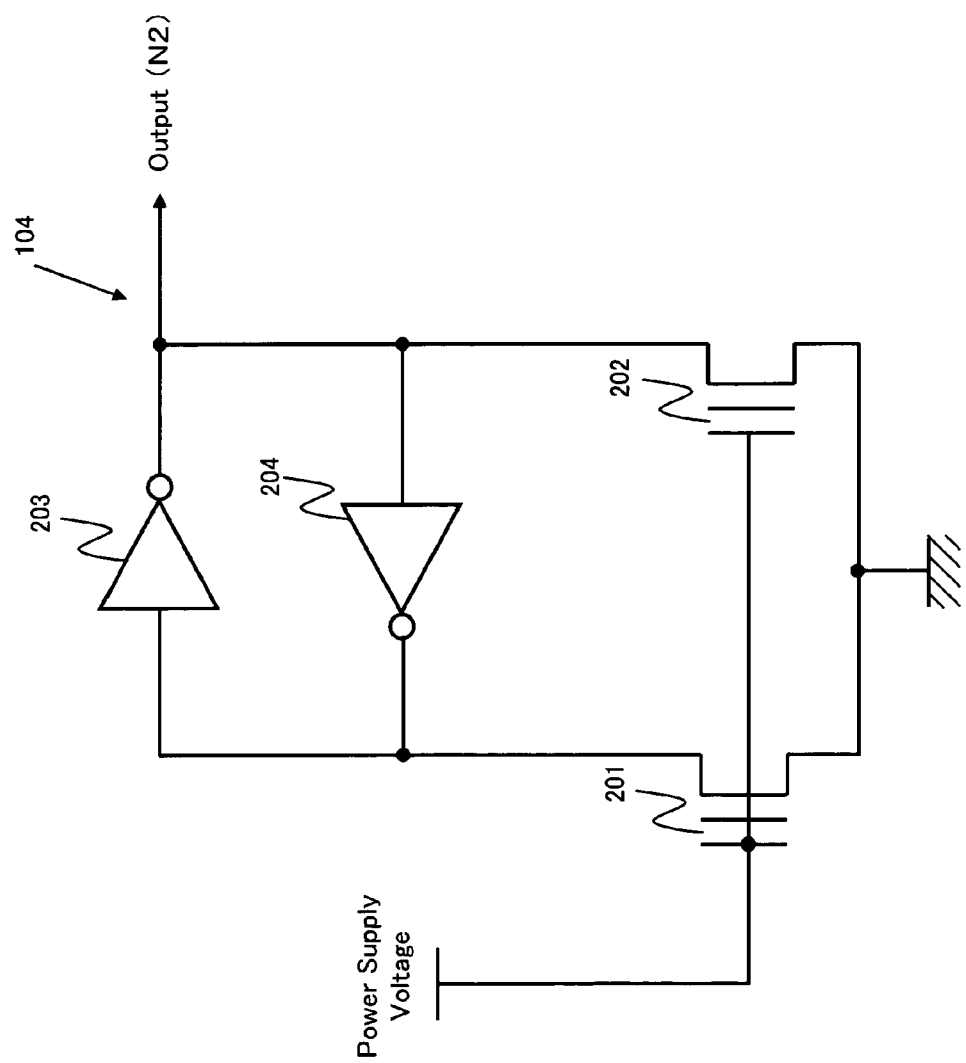
FIG. 2 is a circuit diagram showing an embodiment of a negating signal generation circuit of the test terminal negation circuit according to the present invention.
Figure 3:
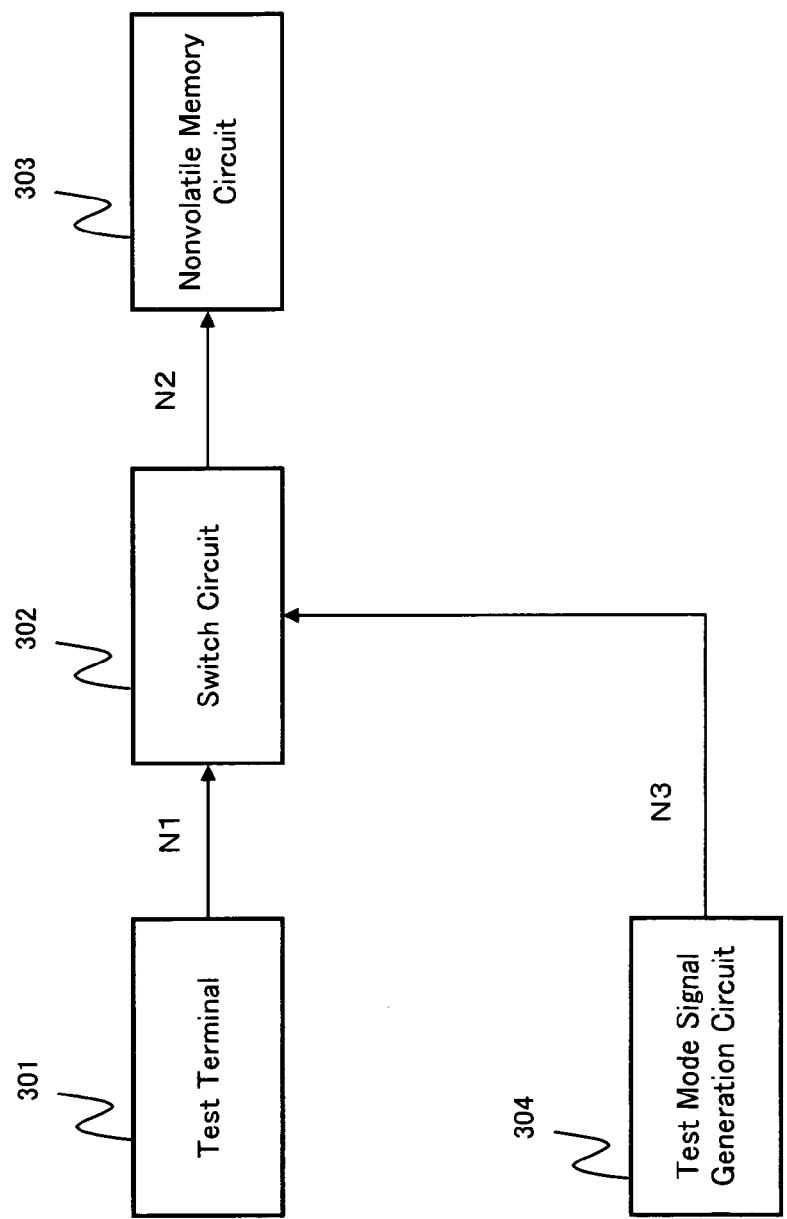
FIG. 3 is a diagram showing a conventional circuit constitution example to transmit a test signal from a test terminal to a test object circuit effectively at the time of a test mode.

The negating signal generation circuit 104 is so constituted that it can output a negating signal which negates the signal outputted from the output node N5 of the switch circuit 102 by force, from an output node N2 to the test signal control circuit 105. More specifically, as shown in FIG. 2, the negating signal generation circuit 104 comprises a first nonvolatile memory element 201 and a second nonvolatile memory element 202 which have an MOSFET structure, a first inverter circuit 203 and a second inverter circuit 204. Here, an output node of the first inverter circuit 203 is the output node N2 of the negating signal generation circuit 104. The first and second nonvolatile memory elements 201 and 202 may have the same structure as that of a nonvolatile memory element used in the nonvolatile memory circuit 106. According to an example shown in FIG. 2, a flash memory element having a stack type of floating gate structure is assumed as each of the nonvolatile memory elements 201 and 202.

According to the negating signal generation circuit 104 shown in FIG. 2, threshold voltages of the first and second nonvolatile memory elements 201 and 202 are lower than a power supply voltage and a voltage difference between the threshold voltages is small in an initial state when the test is started. For example, when the first and second inverter circuits 203 and 204 are CMOS inverters, in a case where W/L (gate width/gate length) of a P-type MOSFET is 1.0/9.8 ($\mu$m), and W/L of an N-type MOSFET is 1.8/0.8 ($\mu$m), since the gate length of the P-type MOSFET of each of the inverter circuits 203 and 204 is long and a current driving ability is low in a state where the first and second nonvolatile memory elements 201 and 202 are both ON, outputs of the inverter circuits 203 and 204 become the ground voltage or close to it.

When the test is completed, a writing operation is performed in the second nonvolatile memory element 202 to increase its threshold voltage to become a power supply voltage level or more, for example. As a result, a difference is generated in drain currents flowing in the first nonvolatile memory element 201 and the second nonvolatile memory element 202, so that an output of the first inerter circuit 203 becomes a high level (for example, the power supply voltage level) and an output of the second inverter circuit 204 becomes a low level (for example, the ground voltage level). Thus, the voltage levels are maintained by the two inverter circuits 203 and 204. Therefore, an output level of the negating signal generation circuit 104 is transited from the low level to the high level by performing the writing operation in the second nonvolatile memory element 202 when the test is completed, to generate a threshold voltage difference between the first nonvolatile memory element 201 and the second nonvolatile memory element 202, and then a negating signal is outputted.

When the test is started, the voltage level of the output node N2 of the negating signal generation circuit 104 is at the low level and when the test mode signal generation circuit 103 is activated and the test mode signal is output from the output node N3, the test signal control circuit 105 is activated and an activated signal is outputted from the output node N1 to the switch circuit 102. Then, the switch circuit 102 is turned on and transmits the test signal outputted from the output node N4 of the test terminal 101, to the output node N5 as it is in the asserted state, to control the nonvolatile memory circuit 106.

When the test is completed, as described above, by transiting the level of the output node N2 of the negating signal generation circuit 104 to the high level, the output signal from the output node N1 of the test signal control circuit 105 is inactivated to turn off the switch circuit 102 regardless of the output state of the test mode signal from the output node N3 of the test mode signal generation circuit 103. As a result, the test signal outputted from the output node N4 of the test terminal 101 is negated to be in a predetermined state and it is not transmitted to the output node N5, so that the nonvolatile memory circuit 106 cannot be controlled from the test terminal 101.

Therefore, although the nonvolatile memory circuit 106 can be controlled by the test signal outputted from the test terminal 101 at the time of the test, the nonvolatile memory circuit 106 cannot be controlled from the test terminal 101 after the test is completed.

The circuit constitution of the negating signal generation circuit 104 is not limited to that shown in FIG. 2 in this embodiment. In addition, although one test terminal 101 is illustrated in FIG. 1, a plurality of test terminals 101 may be provided.

Figure 4:
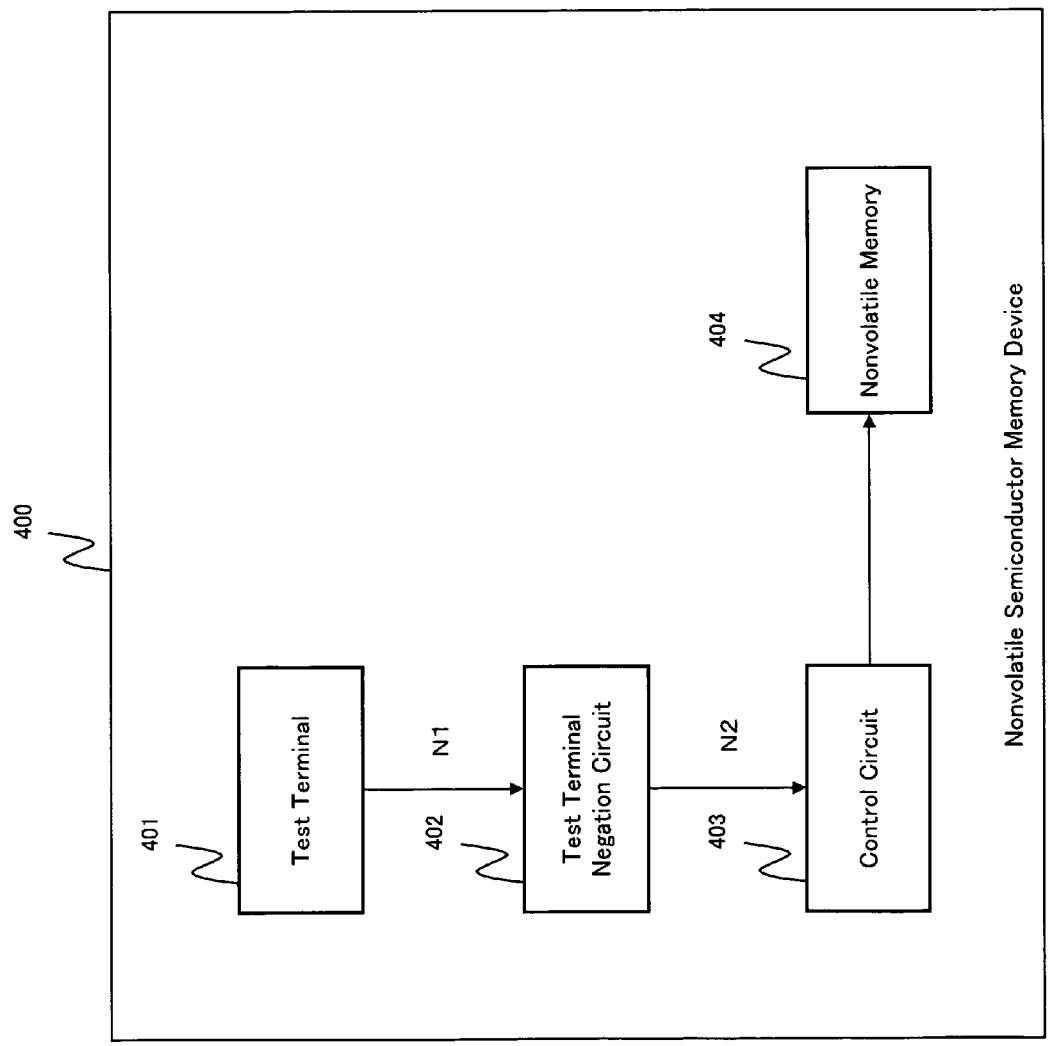
FIG. 4 is a block diagram showing an embodiment of a nonvolatile semiconductor memory device according to the present invention.

FIG. 4 shows an embodiment of a nonvolatile semiconductor memory device according to the present invention. As shown in FIG. 4, a nonvolatile semiconductor memory device 400 according to the present invention comprises a test terminal 401, a test terminal negation circuit 402 according to the present invention, a control circuit 403, and a nonvolatile memory 404. The control circuit 403 receives a test signal from the test terminal 401 and carries out a predetermined test mode process to the nonvolatile memory 404. Since the test terminal negation circuit 402 according to the present invention is provided, the test signal from the test terminal 401 can be negated after a test, so that a test mode is prevented from being activated falsely and the nonvolatile memory 404 is prevented from being controlled from the test terminal 401.

Figure 5:
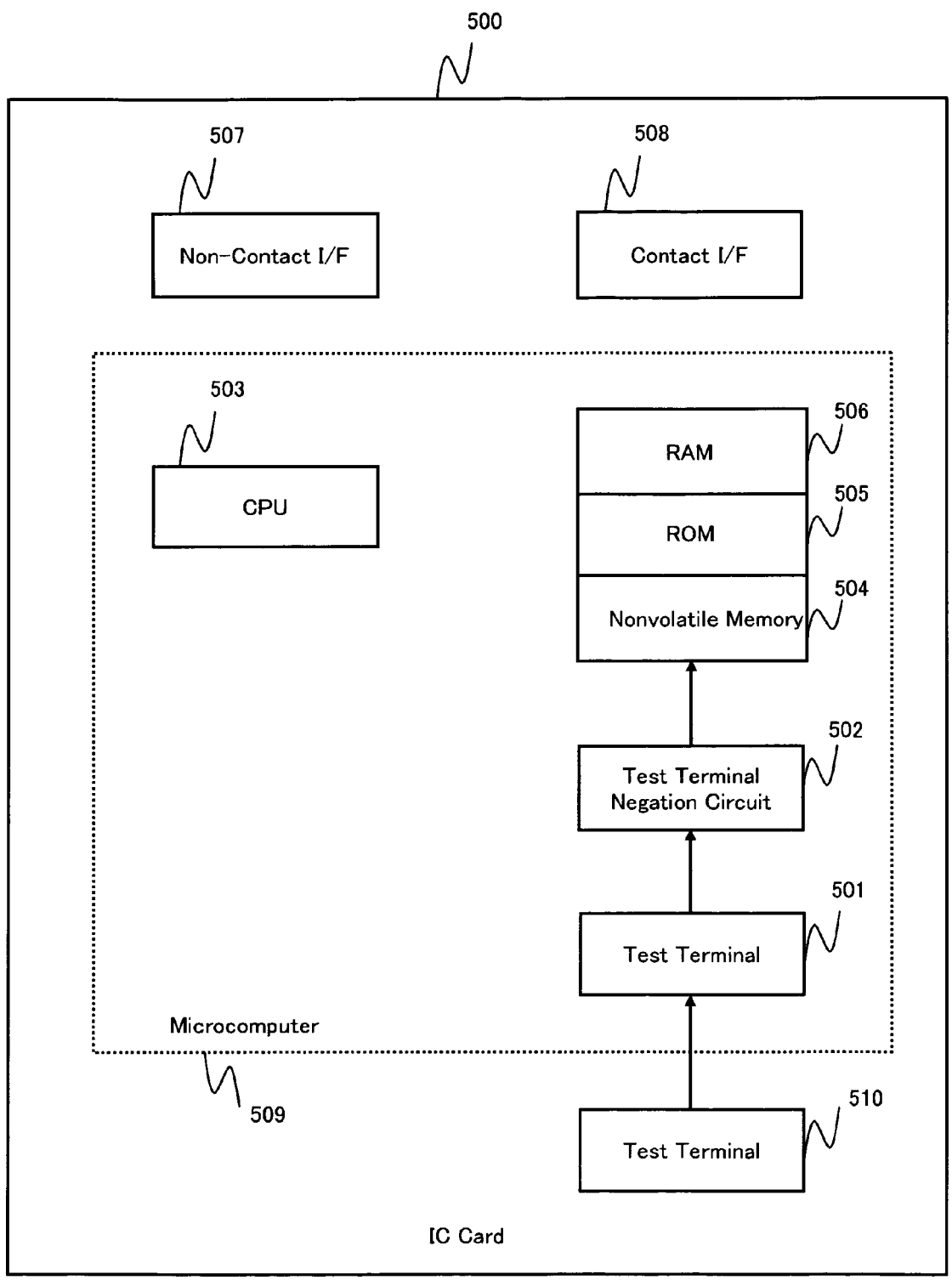
FIG. 5 is a block diagram showing an embodiment of an IC card according to the present invention.

FIG. 5 shows an embodiment of an IC card according to the present invention. As shown in FIG. 5, an IC card 500 according to the present invention comprises a test terminal 510, a microcomputer 509, a non-contact interface circuit 507, and a contact interface circuit 508. The microcomputer 509 comprises a test terminal 501, a test terminal negation circuit 502 according to the present invention, a CPU 503, a nonvolatile memory 504, a ROM 505 and a RAM 506, so that the test terminal negation circuit 502 according to the present invention is provided similar to the nonvolatile semiconductor memory device 400 shown in FIG. 4. A test signal inputted to the test terminal 510 of the IC card 500 is outputted to the test terminal negation circuit 502 through the test terminal 501 in the microcomputer 509, and the test signal is outputted to the nonvolatile memory 504 in an asserted state or a negated state depending on an internal state of the test terminal negation circuit 502. Since the test terminal negation circuit 502 according to the present invention is provided, the test signal from the test terminal 510 is negated after the test, so that the test mode is prevented from being activated falsely and the nonvolatile memory 504 in the IC card is prevented from being controlled from the test terminal 510.

According to the present invention, as described above, since the signal from the test terminal is negated after the test, there can be provided a nonvolatile semiconductor memory device which will not leak inside information. Furthermore, an IC card provided with the above nonvolatile semiconductor memory device can be an IC card with a high-security level.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A test terminal negation circuit comprising:
    a switch circuit which receives a test signal from one or more test terminals and outputs it in an asserted state as it is or in a predetermined negated state to a test object circuit;
    a test signal control circuit which controls an output signal of the switch circuit to be in the asserted state or in the negated state;
    a test mode signal generation circuit which generates a test mode signal which asserts the output signal of the switch circuit and outputs it to the test signal control circuit at the time of a test mode; and
    a negating signal generation circuit which can output a negating signal for forcing the output signal of the switch circuit into the negated state to the test signal control circuit and comprises an electrically rewritable nonvolatile memory element, wherein
    when the negating signal is outputted from the negating signal generation circuit, the test signal control circuit negates the output signal of the switch circuit even when the test mode signal is outputted from the test mode signal generation circuit.

2. The test terminal negation circuit according to claim 1, wherein
    the negating signal generation circuit comprises a first nonvolatile memory element and a second nonvolatile memory element which have a MOSFET structure, a first inverter circuit and a second inverter circuit,
    sources of the first nonvolatile memory element and the second nonvolatile memory element are connected to a ground voltage, gates of the first nonvolatile memory element and the second nonvolatile memory element are connected to a power supply voltage, a drain of the first nonvolatile memory element is connected to an input of the first inverter circuit and an output of the second inverter circuit, and a drain of the second nonvolatile memory element is connected to an output of the first inverter circuit and an input of the second inverter circuit, and
    the output of either the first inverter circuit or the second inverter circuit is an output of the negating signal generation circuit.

3. The test terminal negation circuit according to claim 2, wherein
    an output level of the negating signal generation circuit is varied by a threshold voltage difference between the first nonvolatile memory element and the second nonvolatile memory element.

4. A method of negating a test signal comprising:
    a step of using the test terminal negation circuit according to claim 1, and
    a step of outputting the negating signal by performing electrical rewriting to the nonvolatile memory element in the negating signal generation circuit after a test is completed.

5. A method of negating a test signal comprising:
    a step of using the test terminal negation circuit according to claim 2; and
    a step of outputting the negating signal by performing electrical rewriting to either the first nonvolatile memory element or the second nonvolatile memory element in the negating signal generation circuit after a test is completed.

6. A nonvolatile semiconductor memory device comprising the test terminal negation circuit according to claim 1.

7. An IC card comprising the nonvolatile semiconductor memory device according to claim 6.

* * * * *